United States Patent [19]

Chizinsky

[11] Patent Number: 5,060,354
[45] Date of Patent: Oct. 29, 1991

[54] HEATED PLATE RAPID THERMAL PROCESSOR

[76] Inventor: George Chizinsky, 143 West St., Beverly Farms, Mass. 01915

[21] Appl. No.: 547,805

[22] Filed: Jul. 2, 1990

[51] Int. Cl.$^5$ .................... C23C 16/00; C23C 16/46
[52] U.S. Cl. .................. 29/25.02; 118/716; 118/720; 118/725
[58] Field of Search .......... 29/25.01, 25.02; 118/715, 716, 720, 725

[56] References Cited

U.S. PATENT DOCUMENTS

| | | | |
|---|---|---|---|
| 4,041,278 | 8/1977 | Boah | 219/411 |
| 4,047,496 | 9/1977 | McNeilly et al. | 118/9.1 |
| 4,081,313 | 3/1978 | McNeilly et al. | 156/610 |
| 4,188,908 | 2/1980 | Miller | 118/720 |
| 4,496,609 | 1/1985 | McNeilly et al. | 427/55 |
| 4,753,192 | 6/1988 | Goldsmith et al. | 118/715 |
| 4,755,654 | 7/1988 | Crowley et al. | 219/405 |
| 4,796,562 | 1/1989 | Brors et al. | 118/725 |
| 4,857,689 | 8/1989 | Lee | 219/10.71 |
| 4,870,923 | 10/1989 | Sugimoto | 118/715 |
| 4,913,929 | 4/1990 | Moskehi et al. | 118/715 |
| 4,919,077 | 4/1990 | Oda et al. | 118/725 |
| 4,924,807 | 5/1990 | Nakayama et al. | 118/725 |

OTHER PUBLICATIONS

Nucl. Instu and Meth. in Phyics Res. (1985) pp. 316–320, Gelpey, et al.
A New VLSI Compat. Rapid Therm. Proc. 545, pp. 622–626 Aitken et al. (1987).

Primary Examiner—Olik Chaudhuri
Assistant Examiner—Ken Horton
Attorney, Agent, or Firm—Donald N. Halgren

[57] ABSTRACT

A rapid thermal processor for heat treating and cooling semiconductor material is an elongated process chamber having a base, side and top walls which enclose a heater plate assembly through which thin pins longitudinally move to carry workpieces vertically to and from the heater assembly. A cooling shutter is adapted in the chamber to shield the workpiece from the heater plate when the cooling process takes place. The chamber has gaseous ambient control means which regulates the type of atmosphere or vacuum in the chamber during heat processing of the workpiece.

5 Claims, 4 Drawing Sheets

HEATED PLATE RAPID THERMAL PROCESSOR

BACKGROUND OF THE INVENTION (1) Field of Invention

This invention relates to an apparatus for heat processing of wafer-like objects, and more particularly to rapid thermal processing devices for the controlled manufacture of semiconductor type components.

(2) Prior Art

After the advent of the semiconductor industry some forty years ago, came the development of "tube" furnaces, which have been utilized to fabricate semiconductor devices from wafers of materials such as germanium, silicon and gallium arsenide. These tube furnaces were originally of horizontal orientation, consisting of an elongated heater positioned around a long cylindrically shaped tube, usually fabricated of quartz, with process gases entering one end of the tube and exiting at the other end. Tube furnaces have also been used for processing solar cells and non semiconductor materials for other applications. Tube furnaces are typically used with an atmospheric pressure ambient for standard processes and in a vacuum mode for when they are utilized in chemical vapor deposition processes.

Tube furnaces inherently require a long time to complete a process, because of the thermal inertia due to their large mass and their typical batch processing of wafers, but also because the furnace must be cooled down from its high operating temperatures to a lower temperature for loading and unloading of the wafers, to avoid thermal stresses on those wafers. In the early 1980's, the first rapid thermal type processors were developed as monitoring instruments, to serve as a fast way of processing "control" wafers by which the results of a tube furnace process called post-implant annealing (temperatures of 1000-1200 degrees C.) could be predicted.

This more rapid thermal processing (heating and cooling) of wafers disclosed many inherent advantages, which included the generic advantage of minimizing any shift of the semiconductor junction in the wafer. These early rapid thermal processors were driven towards speed as an end to itself, wherein high powered lamps were the preferred heating technique. Examples of some of these processors are described below. Most of the results with these techniques have been proven to be unsatisfactory, because of the lack of uniformity and consistency in the finished products, and the necessity for frequent adjustment and lamp replacement. These disadvantages have slowed the acceptance of rapid thermal processing as a replacement to tube furnace processing.

To hold a uniform temperature across a wafer which is essentially suspended in a free space—as it is being heated—and then cooled, using a high powered light flux, is extremely difficult, because of the many transients that occur as a consequence of large power changes that may take place in a few seconds. The lamps are expensive and do have to be replaced quite often because of their degradation through use. Also, in chemical vapor deposition, byproducts such as amorphous silicon, ammonium chloride and silicon dioxide build up upon the window between the lamps and the wafer being treated, thereby changing the heat flux upon the wafer.

An example of the use of lamps and their use is shown in U.S. Pat. No. 4,755,654 to Crowley et al. A quartz window is disposed between the lamp and the wafer being treated to modify the distribution of the light (heat) onto the wafer.

An earlier example of a tube type heating apparatus is shown in U.S. Pat. No. 4,041,278 to Boah. This patent shows a tubular quartz glass chamber with an infrared radiation source. This device utilizes infrared lamps to heat wafers optically for heating one side of a wafer.

A more recent device for treating wafers with chemical vapor deposition is shown in U.S. Pat. No. 4,796,562 to Brors et al. This apparatus utilizes cylindrical lamps to heat the wafer as uniformly as possible, in a flowing gas stream. Inherent in these lamp heated devices, is the problem of controlling the optical features which effects the uniformity of the product.

U.S. Pat. Nos. 4,081,313; 4,047,496 and 4,496,609 to McNeilly et al each show a reactor with a bank of high intensity lamps as a heat source.

Still yet another processor for wafer semiconductor processing is shown in U.S. Pat. No. 4,857,689 to Lee. This device comprises an elongated structure with the top enclosed within a heater and with a temperature gradient from top to bottom. A wafer is brought vertically toward the heated section. An optical sensor is arranged at the lower side of the wafer being treated, to regulate the amount of vertical travel of the wafer, up towards the top of the elongated structure until the wafer achieves the desired temperature. This device is an improvement over the thermal processors aforementioned, because of its temperature uniformity and repeatability, but its hot walls, which are an integral part of the device, become coated with deleterious byproducts of any chemical vapor deposition process. Furthermore, the large volume of the elongated structure is not readily adaptable to sequential processing. More importantly, the device does not adapt as well to various sizes and shapes of the objects to be processed as does the present invention.

BRIEF SUMMARY OF THE INVENTION

The present invention comprises a rapid thermal processor device utilizing a heated plate, having a wafer supporting means extending through the plate. The heated plate comprises a massive element at the base of an extended vertical process chamber. The innermost top portion of the extended vertical chamber comprises a heat sink arrangement. The side walls, and top of the chamber are provided with a cooling arrangement so as to effectuate an extreme temperature differential between the heated plate and top portions of the chamber. The temperature of the heated plate establishes the temperature of a wafer placed in contact or close proximity to the heater plate. This permits temperature monitoring of the wafer by a thermocouple arranged in the heater plate, as opposed to the prior art methods of rapid thermal processing where the temperature is monitored by infrared pyrometers aimed at the backside of the wafer and which are subject to backside emissivity variations.

A loading and discharging gate is disposed through an upper portion of the side wall of the chamber. The gate permits workpieces such as wafers of semiconductor material to be disposed onto a vertically translatable support pin arrangement. The gate opens and closes to allow a robotic transport arm to deliver wafers from a supply, to the support pins within the upper portion of the chamber. The gate also opens and closes to permit the transport arm to remove treated wafers from the support pins within the process chamber, back through the gate, and to a treated wafer receiving arrangement.

The support pins, movably extend through the base of the process chamber and through the heater plate. A reflecting dish is disposed between the heater plate and the base of the chamber. An elevator means is arranged on the proximal end of the support means and effectuates their vertical displacement. The pins are disposed in conduits through the heater plate, which conduits extend down through and beneath the base of the process chamber. The lower ends of the conduits are in fluid communication with one another, and through a manifold, are connected to a gas or a vacuum source. The gas or vacuum conduits can be utilized either to ensure gas ambient integrity in the process chamber when the wafer is being supported in proximity to the heater plate, or to insure surface engaging contact between the wafer and the heater plate.

If the process chamber is to be utilized for vacuum processing or for chemical vapor deposition, a vacuum plenum is disposed about the bottom of the base, around the inside of its periphery. The vacuum plenum is in fluid communication with the inside of the process chamber. A reactant gas discharge nozzle is disposed on the inside periphery of the side walls of the chamber, for chemical vapor deposition utilization therein.

A shutter receiving compartment may also be disposed through the side wall of the process chamber, to permit a shutter to be moved across the process chamber, beneath the wafer disposed upon the transport arm of a robotic loading and unloading means, the shutter being articulable between the wafer and the heater plate. The shutter may be solid or have a cooling means through it, or if it is to cross the path of the support pins in a further embodiment, it may have a plurality of slots arranged partway across the shutter. The pins in that embodiment would then mate with the slots in the shutter to permit the movement of the shutter across the chamber, to isolate the wafer from radiation from the heater plate.

The heater plate may have in one embodiment, a wall extending upwardly from its perimeter. The wall helps maintain the uniformity of the temperature across the diameter of the wafer, as the wafer is displaced on the pins, away from the heater plate. This heater plate wall would be utilized in heat treatment or for a surface conversion of the wafers, which processes would not include chemical vapor deposition.

When the process chamber is to be utilized for chemical vapor deposition in a further embodiment, an insulator support strip, may be disposed about the periphery of the heater plate, so as to be able to contact the perimeter of any wafer, permitting it to be disposed just above the surface of the heater plate. The insulator support strip is arranged upon a cooled channel thereunder, which also is disposed peripherally adjacent the heater plate.

In yet a further embodiment for chemical vapor deposition, the insulator support strip and cooled channel thereunder, are of a slightly larger dimension than the outer dimension of the wafer, to permit the wafer to have surface engaging contact with the heater plate. The support pins would be completely retracted within their conduits in both cases.

The robotic transport arm which feeds treated wafers and withdraws treated wafers from the distal end of the support pins, as well as from the wafer storage, may itself, be enclosed within an external housing, for which the ambient may be regulated by evacuation and/or purging with a gas, so as to minimize degradation of any atmosphere within the chamber, as wafers are being shuttled with respect thereto.

In a further embodiment, it is contemplated having the heater plate at the upper end of the chamber, with a plurality of pins being movably disposed through the base of the chamber, as in the aforementioned embodiments. (The wafer could be held on a shaft, the distal end of which carries a plate and support pins for holding a wafer thereon). In this embodiment, rotation of the wafer would permit an even more precisely uniform treatment thereof when the wafer is heated in the proximity mode. Vacuum or gas conduits may be disposed through the heater plate, which then would be utilized either to ensure surface engaging contact between the wafer and the "top arranged" heater plate, or to ensure gas ambient integrity in the process chamber when the wafer is being supported in proximity to the heater plate.

BRIEF DESCRIPTION OF THE DRAWINGS

The objects and advantages of the present invention will become more apparent, when viewed in conjunction with the following drawings, in which.

DESCRIPTION OF THE PREFERRED EMBODIMENTS

Figure 1:
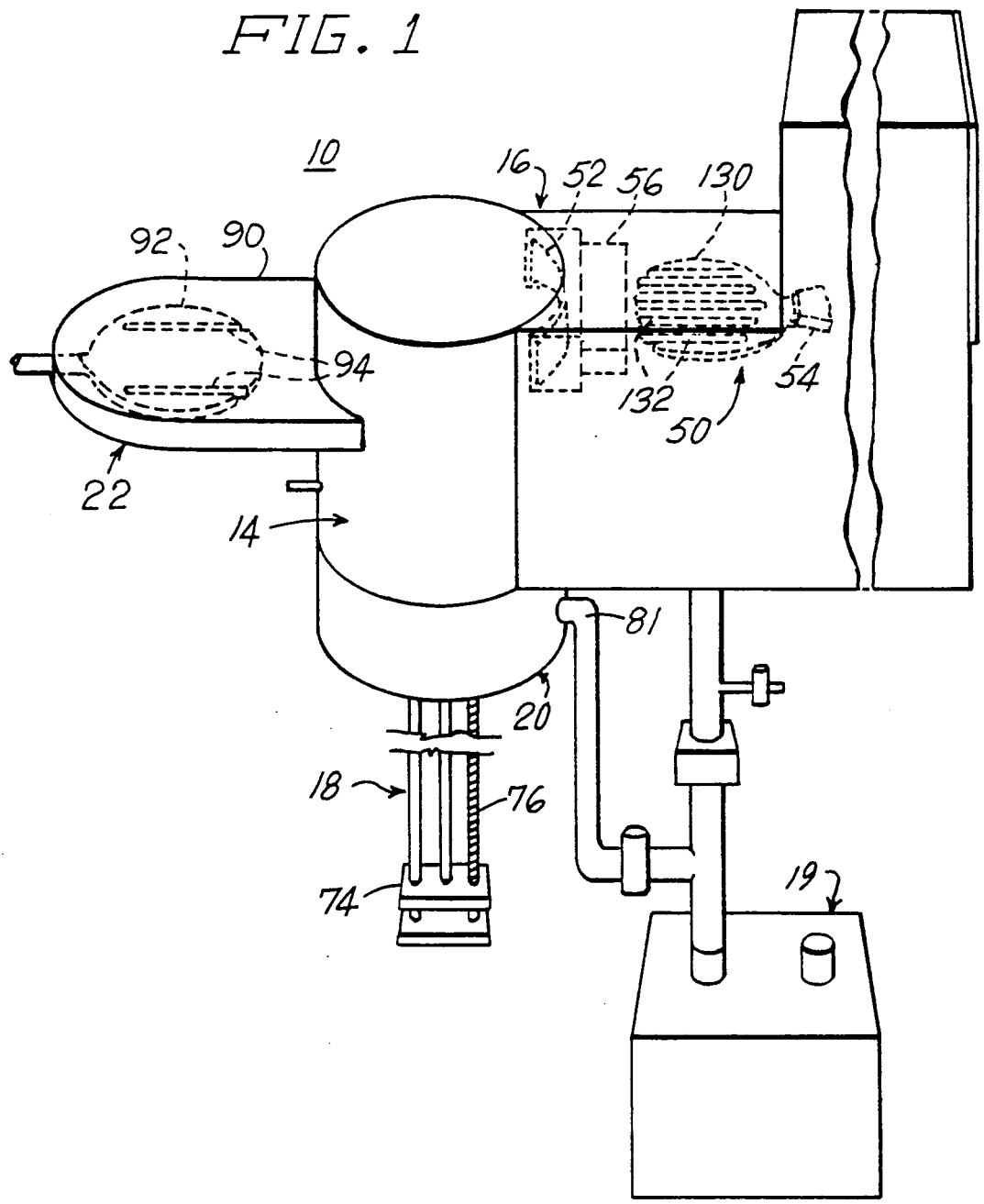
FIG. 1 is a perspective view of the treatment chamber with its associated service components for moving, loading/unloading/shielding and treating semiconductor wafers.
Figure 2:
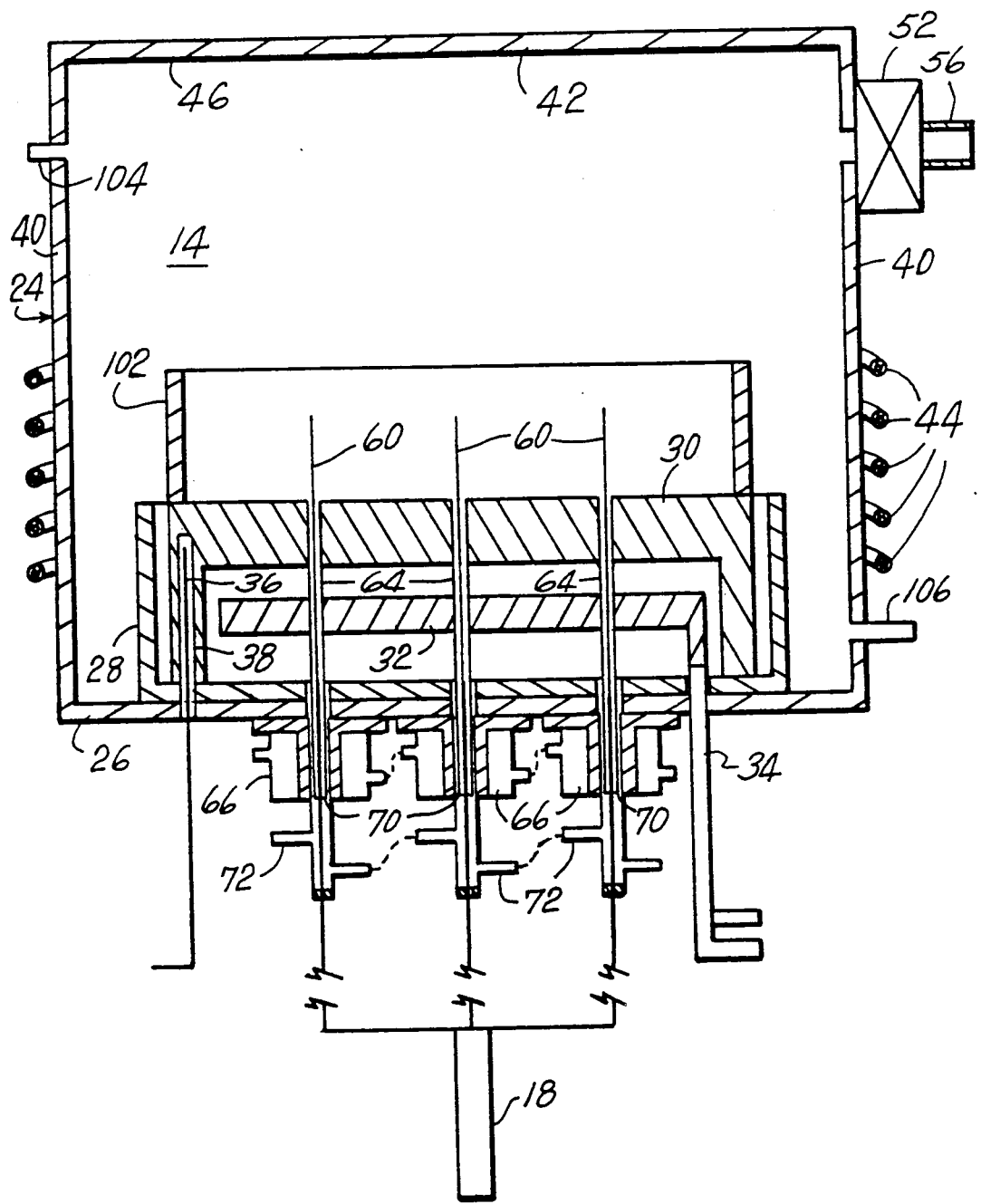
FIG. 2 is a side elevational view of the treatment chamber, when utilized for non-vacuum and non-chemical vapor deposition treatment of a wafer.

Referring now to the drawings in detail, and particularly to FIGS. 1 and 2, there is shown a rapid thermal processor device 10 for the treatment of semiconductor wafers 62, utilized primarily in the electronics industry. The rapid thermal processor device comprises a process chamber 14, a wafer feeding arrangement 16, an elevator arrangement 18, a vacuum generator 19 a vacuum plenum apparatus 20, and a shutter apparatus 22. Rapid thermal processing is critically defined as a temperature heat-up rate of at least 50 degrees Centigrade per second and a cool down rate of at least 25 degrees Centigrade per second, the upper limits of that range being about 1400 degrees Centigrade.

Figure 3:
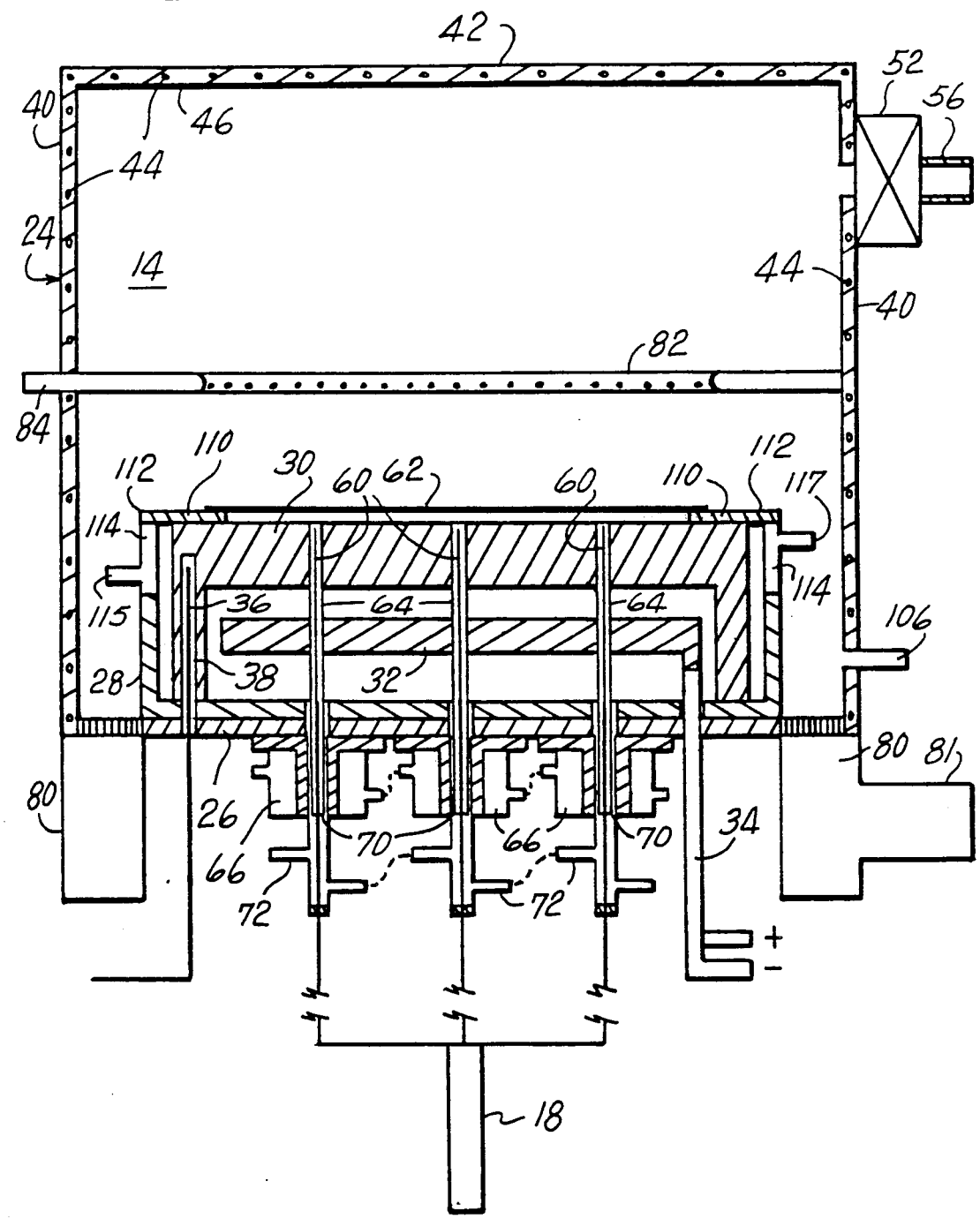
FIG. 3 is a side elevational view of the treatment chamber, when utilized for chemical vapor deposition treatment of a wafer.

The process chamber 14 is shown in more detail, in cross-section in FIGS. 2 and 3. The process chamber 14 comprises an extended vertically disposed chamber 24 having a base 26. A reflector insulator dish 28 is disposed upon the base 26. The dish 28 may be made from a material such as quartz, alumina, or other material which can withstand high temperatures, and act as a thermal insulator and heat reflector. The dish 28 may also be coated with an inert reflective material such as gold.

A heated plate 30, having a large mass compared to the anticipated workpieces (wafers etc.) is arranged within the chamber 14, as shown in FIGS. 2 and 3. The heater plate 30 may be fabricated from material such as silicon carbide, quartz, inconel, or other material which will not react at the processing temperatures 300 degrees Centigrade to about 1400 degrees Centigrade, with any ambient gases in the chamber 14 or with the material comprising the workpiece, depending on the temperature requirements of the application.

A heat source 32, such as a resistive heating element or other such conductive/radiant heat source, is disposed between the heated plate 30, and the dish 28, as shown in both FIGS. 2 and 3. The heat source 32 has a power conduit 34 connected to a proper power source, not shown. A thermocouple 36 is disposed in a conduit 38, disposed through the base 26 and dish 28, and extends into the heated plate 30.

The process chamber 14 has vertical walls 40 and an upper cover 42, which have cooling means 44 arranged externally or internally, as shown in FIGS. 2 and 3. The inside surface of the upper cover 42 may be coated with a radiation-absorbing layer of material 46 such as black chrome or black nickel, to aid in cooling of any close wafer being treated therein. The cover 42 alternatively, may be hingedly attached to the walls 40 or completely removable for loading workpieces such as wafers 62, manually into the chamber 14.

Figure 4:
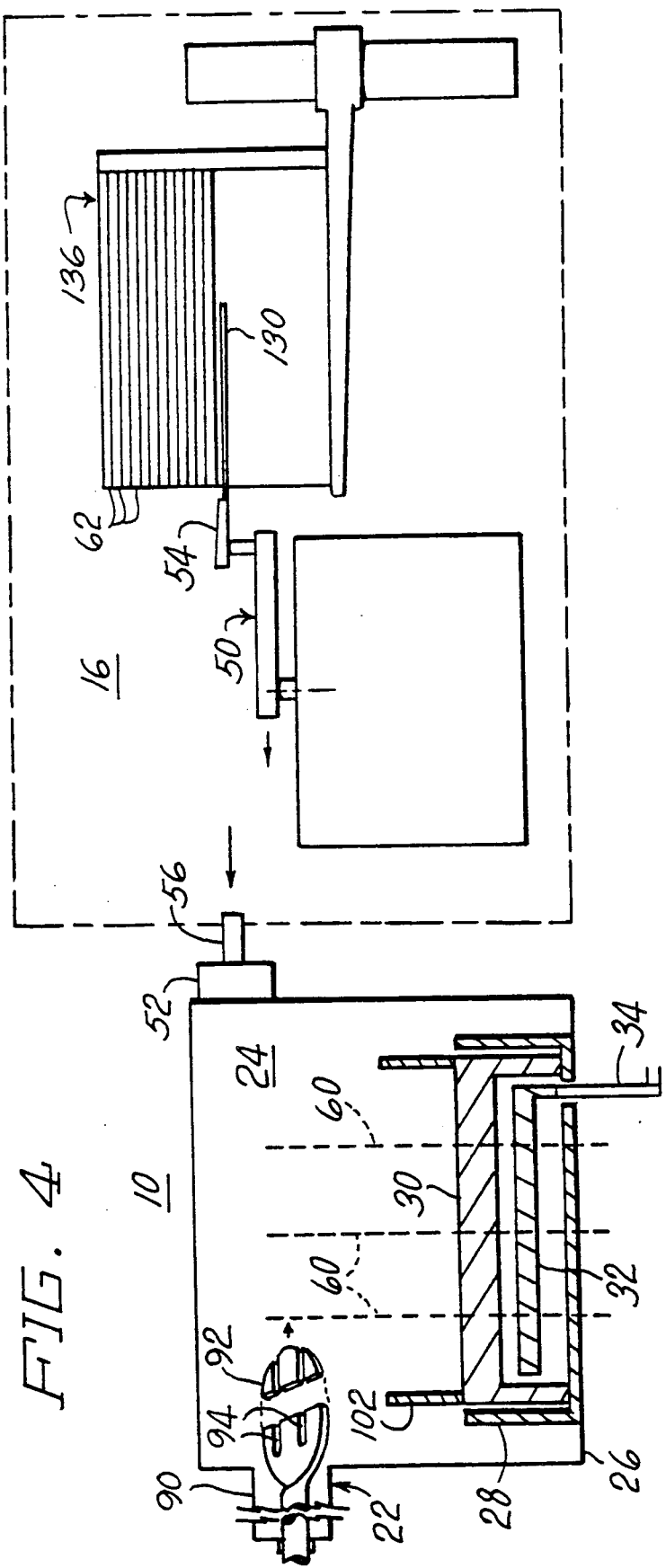
FIG. 4 is schematic representation of the treatment chamber and its loading/unloading and shielding mechanisms arranged therewith.

The preferred embodiment includes an automatic loading and discharge means 50, as shown schematically in FIGS. 2 and 3, and more particularly in FIG. 4, located at an upper portion of the vertical walls 40. The loading and discharge means 50 comprises a gate having a door 52 which is displacable to permit passage of a robotic transport arm 54, shown in both FIGS. 1 and 4. The gate 52 has a narrow conduit 56 which defines a long flow path in comparison to its cross-section, to minimize the backstreaming of atmosphere from outside of the process chamber 14. Only a shortened conduit 56 is shown for clarity in FIGS. 1 and 2. The gate 52 may be opened and closed by proper circuitry, to permit the transport arm 54 to deliver and retrieve any wafers, to and from a plurality of displacable support pins 60 extending through the base 26 of the chamber 14.

The support pins 60 are the preferred means utilized to raise and lower the semiconductor wafers 62 away from and towards the hearer plate 30. The pins 60, three of which are shown in the drawings, are thin diameter distally tapered members constructed from quartz, aluminum oxide, silicon carbide, or other high temperature resistant materials. An arrangement of tubular conduits 64 of inconel or other heat and oxidation resistant material, are disposed through the heated plate 30, the heat source 32, the dish 28 and the base 26. Each conduit 64 has a flanged seal 65 and a cooled channel 66 disposed around it, beneath the base 26, each of the channels 66 being in fluid communication with one another, and a proper cooling fluid source, not shown. Each conduit 64 has a lower end 70 sealed from the cooling channels 66 and which is in fluid communication with a vacuum source not shown, through a manifold 72. The pins 60 extend through each lower end 70 of the each conduit 64 in a slidingly sealed manner, and are attached to the elevator means 18, as shown in FIGS. 2 and 3. The elevator means 18 shown more particularly in FIG. 1, comprises an elevator base 74 with powered lead screw 76, or a hydraulic or other lift means with which to move the support pins 60.

In the embodiment of my invention which is adapted for chemical vapor deposition, such as shown in FIG. 3, a vacuum plenum 80 is disposed about the bottom of the base 26. The plenum 80 is in fluid communication with the inside of the chamber 14 and has a discharge conduit 81 connected to a proper vacuum source 19, shown in FIG. 1.

An extended chemical vapor discharge nozzle 82 is arranged on the inside periphery of the walls 40 of the chamber 14, at about the mid-level thereof, as shown in FIG. 3. The nozzle 82 has at least one delivery conduit 84 for supplying the gaseous ambient, such as nitrogen, silane or oxygen, during chemical vapor deposition processes.

An insulator support strip 110, composed of quartz or other insulation material capable of withstanding high temperatures, is disposed about the periphery of the heater plate 30, overlapping the edge thereof, as shown in FIG. 3. The support strip 110 has an outer periphery 112 which is arranged to rest upon a water cooled metal channel 114. The water cooled channel 114, having proper supply and discharge conduits 115 and 117, is disposed upon the upper periphery of the reflector dish 28.

A shutter receiving compartment 90, represented only in FIGS. 1 and 4, is arranged through the side wall 40, slightly vertically displaced beneath the height of the loading and discharge gate 52. The compartment 90 is adapted to permit a shutter 92 to be moved by a proper means, across the process chamber 14 beneath any wafer supported on the receiving support surface 130 on the outer end of the robotic transport arm 54. The shutter 92 preferably is of plate-like configuration having cooling means therein, not shown. The shutter 92, the heater plate 30 and chamber 14 may be configured to conform to the geometric shape of a workpiece. In another embodiment, as seen in FIG. 1, the shutter 92 may have several narrow slots 94 disposed partway across it. The pins 60 mate with the slots 94 to permit movement of the shutter 92 across the chamber 14, as the pins 60 as aforementioned, are supporting a wafer in its cooling mode, near the upper portion of the chamber 14, thus isolating the wafer from the heater plate 30.

The heater plate 30, in the atmospheric or vacuum (nonchemical vapor deposition) processing embodiment thereof shown in FIG. 2, has a thin upstanding wall 102, disposed around the periphery thereof, for about one-half of the height of the wall 40 of the process chamber 14. The upstanding wall 102 permits a decreasing temperature gradient to react with one wafer as it is elevated on the support pins 60 away from the heater plate 30. The upstanding wall 102 minimizes excessive thermal stresses that might otherwise occur at the edges of the wafers, because of their cooling faster, from the high temperature of the heater plate 30. Also shown in FIG. 2, is an inlet tube 104, connected to a proper valve, not shown, to allow selected gas flow into the process chamber 14. An outlet tube 106, with a check valve, may be disposed at a lowermost location diagonally across from the inlet valve 104, to facilitate ideal gas flow across the chamber 14 and prevent backstreaming of atmosphere from outside of the chamber.

When the process chamber 14 is utilized to treat wafers with a chemical vapor deposition, as shown in FIG. 3, the support pins 60 are retracted beneath the upper surface of the heater plate 30, and the periphery of the wafer 62 rests on the edge of the insulator support strip 110. In another embodiment for chemical vapor deposition, the wafer may lie within the insulator support strip 110.

When the process chamber 14 is utilized in the atmospheric pressure/contact mode represented by FIG. 2, a vacuum may be drawn down the conduits 70 which contain the support pins 60, to facilitate drawing the wafer 62 against the surface of the heater plate 30, to help the wafer 62 more fully receive the heat from the plate 30. When the process chamber 14 is utilized in the atmospheric pressure/proximity mode, the support pins may maintain the wafer 62 a short distance above the heater plate 30. In this embodiment, the conduits 70 may be used to supply purge gas of the same kind as utilized in the chamber, in order to maintain gas ambient integrity in the process chamber 14.

The wafer feeding arrangement 16, partially shown in FIG. 1, and represented more particularly in FIG. 4, shows the transport arm 54 having the receiving support surface 130 disposed on its distal end. The receiving support surface 130 may have a plurality of fingers 132 which are adapted to let the support pins 60 pass through it when the transport support surface 130 supplies and retrieves wafers 62 from the pins 60. The transport arm 54 is articulable so as to remove untreated wafers from a wafer supply 136, as shown in FIG. 4, deliver the wafer 62 on the distal end of the support pins 60 to their fully extended location, and retrieve the treated wafer 62 therefrom. Thereupon, a fresh untreated wafer is loaded onto the free ends of the support pins 62 by the support surface 130 from the water supply 136, and the pins 60 are then retracted toward the hot heater plate 30 to enable the wafer to be heat treated, and then recycled toward the top of the chamber 14, cooling the wafer down, and removing the wafer for storage in the wafer supply 136.

A further embodiment is contemplated, where the heater plate 30, the heat source 32 and the reflector/insulator dish 28, are disposed at the top of the chamber 40, instead of at the bottom as they are shown in FIGS. 2 and 3. The support pins 60 in such a top heater arrangement, would be attached to a single shaft, not shown, extending through the base 26 of the process chamber 14, and cooling of any wafers thereon would be effected by withdrawing of the heated/treated semiconductor (wafers) workpieces downwardly towards the base, which would have the radiation absorbent material thereon, facilitating cooling of that wafer.

In yet a further embodiment for the support pins 60, in a top heater arrangement, the shaft attached to the support pins 60 could be rotated, thus effectuating further improvements in the uniformity of heat and gas flow to the wafers treated thereon.

Summarizing the heating modes for this rapid thermal processing device, a workpiece may be heated:

(a) "initially" in the proximity of the heater plate (no contact) followed by direct contact heating, for atmospheric pressure processing;

(b) initial direct contact followed by proximity heating for medium temperature (about 500–600 degrees Centigrade) vacuum processes where the workpiece to be heated is relatively transparent to infrared radiation at low temperatures;

(c) direct contact heating for low temperature chemical vapor deposition processing where the workpiece to be heated is relatively transparent to infrared radiation at low temperatures (about 400–500 degrees Centigrade); and (d) proximity heating for atmospheric pressure processing when the operating temperature would cause reaction between the heater surface and the workpiece, for high temperature (about 600–1200 degrees Centigrade) vacuum processing, and for higher temperature (about 500–900 degrees Centigrade) chemical vapor deposition processing.

Thus what has been shown and described is a novel apparatus for the rapid thermal processing of semiconductor wafer material and flat panel display devices utilizable for a number of heating and proximity/contact modes, and wherein a heating and wafer support mechanism are enclosed in a novel processing chamber to efficiently and uniformly treat wafers in a vacuum or a gaseous ambient, with the facility to cool the treated waters rapidly while minimizing thermal gradient problems heretofore associated with thermal processing.

I claim:

1. A rapid thermal processor for heat processing and cooling of semiconductor wafer material, comprising:
   an elongated process chamber defined by a base, side walls and an upper wall;
   a heater plate disposed within said process chamber for delivering heat to and establishing the temperature of the wafer within said process chamber;
   means for advancing and withdrawing a wafer with respect to said heater plate; and
   cooling means disposed within said process chamber to facilitate rapid temperature drop within said wafer;
   and wherein said upper wall of said process chamber has an inner surface with a radiation absorbent material disposed thereon.

2. A rapid thermal processor as recited in claim 1, wherein said absorbent material is black chrome or black nickel.

3. A rapid thermal processor for heat processing and cooling of semiconductor wafer material, comprising:
   an elongated process chamber defined by a base, side walls and an upper wall;
   a heater plate disposed within said process chamber for delivering heat to and establishing the temperature of the wafer within said process chamber;
   means for advancing and withdrawing a wafer with respect to said heater plate; and
   cooling means disposed within said process chamber to facilitate rapid temperature drop within said wafer;
   said means for advancing and withdrawing a wafer comprises a plurality of support pins; and
   a movable shutter means which is movable transversely with respect to said support pins, so as to facilitate cooling of a wafer on said support pins when they are distally advanced away from said heater plate, by shielding said wafer from said heater plate.

4. A rapid thermal processor as recited in claim 3, wherein said shutter means has a plurality of slots disposed thereacross, so as to permit said shutter to pass between said wafer being treated and said heater plate, said pins mating with said slots therein.

5. A rapid thermal processor as recited in claim 2, wherein said shutter means has a heat transfer means arranged therein.

* * * * *